United States Patent
Christensen

(10) Patent No.: US 9,509,345 B2
(45) Date of Patent: *Nov. 29, 2016

(54) RF TRANSMITTER FOR ELECTRICALLY SHORT ANTENNA

(71) Applicant: OTICON A/S, Smørum (DK)

(72) Inventor: Kåre Tais Christensen, Smørum (DK)

(73) Assignee: OTICON A/S, Smørum (DK)

( * ) Notice: Subject to any disclaimer, the term of this patent is extended or adjusted under 35 U.S.C. 154(b) by 0 days.

This patent is subject to a terminal disclaimer.

(21) Appl. No.: 14/925,760

(22) Filed: Oct. 28, 2015

(65) Prior Publication Data

US 2016/0049967 A1 Feb. 18, 2016

Related U.S. Application Data

(63) Continuation of application No. 13/683,132, filed on Nov. 21, 2012, now Pat. No. 9,203,446.

(60) Provisional application No. 61/563,618, filed on Nov. 25, 2011.

(30) Foreign Application Priority Data

Nov. 25, 2011 (EP) .................................. 11190731

(51) Int. Cl.
| | |
|---|---|
| *H01Q 11/12* | (2006.01) |
| *H04B 1/04* | (2006.01) |
| *H04M 1/00* | (2006.01) |
| *H03J 5/00* | (2006.01) |

(52) U.S. Cl.
CPC .. *H04B 1/04* (2013.01); *H03J 5/00* (2013.01)

(58) Field of Classification Search
CPC ............. H04B 5/0081; G06K 7/0008; G06K 19/0723; G06K 19/0726
USPC .............................. 455/121, 123, 127.1, 572
See application file for complete search history.

(56) References Cited

U.S. PATENT DOCUMENTS

| | | |
|---|---|---|
| 4,048,578 A | 9/1977 | Kimura |
| 5,196,735 A | 3/1993 | Meier |
| 5,698,838 A | 12/1997 | Yamaguchi |

(Continued)

FOREIGN PATENT DOCUMENTS

| | | |
|---|---|---|
| CN | 101373957 A | 2/2009 |
| EP | 2124346 A2 | 11/2009 |

(Continued)

*Primary Examiner* — Simon Nguyen
(74) *Attorney, Agent, or Firm* — Birch, Stewart, Kolasch & Birch, LLP

(57) ABSTRACT

An RF transmitter comprises a capacitive energy storage, an output stage and a switching circuit with an open state and a closed state. The capacitive energy storage forms with the antenna when connected thereto a resonance circuit with a resonance frequency and a quality factor. The output stage provides an electric transmission signal to the resonance circuit. The switching circuit comprises a first transistor for switching between the open state and the closed state and is connected to an antenna output terminal through a capacitance formed by the capacitive energy storage such that the maximum signal voltage occurring across the switching circuit in its open state is lower than the maximum signal voltage occurring across the antenna output terminals. The transmitter is adapted to alter the quality factor by changing the series resistance of the switching circuit in its closed state.

19 Claims, 7 Drawing Sheets

(56) References Cited

U.S. PATENT DOCUMENTS

| | | | |
|---|---|---|---|
| 5,874,725 A | 2/1999 | Yamaguchi | |
| 6,229,494 B1 | 5/2001 | Merenda | |
| 6,424,820 B1* | 7/2002 | Burdick | H04B 5/0081 455/132 |
| 6,547,149 B1 | 4/2003 | Wuidart et al. | |
| 6,685,096 B1 | 2/2004 | Degrauwe et al. | |
| 7,158,009 B2 | 1/2007 | Watanabe | |
| 7,429,805 B2 | 9/2008 | Hamel et al. | |
| 7,474,149 B2 | 1/2009 | Snelgrove et al. | |
| 7,528,725 B2 | 5/2009 | Stewart | |
| 7,692,529 B2 | 4/2010 | Hagl et al. | |
| 7,804,454 B1 | 9/2010 | Mileski | |
| 9,203,446 B2* | 12/2015 | Christensen | H04B 1/04 |
| 2004/0214535 A1 | 10/2004 | Khorram | |
| 2004/0217171 A1 | 11/2004 | Devos et al. | |
| 2006/0273882 A1* | 12/2006 | Posamentier | G06K 19/0723 340/10.4 |
| 2006/0286938 A1* | 12/2006 | Murdoch | G01S 13/74 455/73 |
| 2008/0033411 A1 | 2/2008 | Manvel Artyom et al. | |
| 2008/0218314 A1* | 9/2008 | Van Eeden | G06K 19/0701 340/10.1 |
| 2009/0033411 A1 | 2/2009 | Meier | |
| 2009/0153300 A1 | 6/2009 | Meier | |
| 2009/0284220 A1* | 11/2009 | Toncich | G06K 7/0008 320/108 |
| 2010/0102932 A1* | 4/2010 | Hill | G06K 7/0008 340/10.1 |
| 2011/0319018 A1 | 12/2011 | Kroman | |
| 2013/0063160 A1 | 3/2013 | Nakano et al. | |
| 2013/0069585 A1 | 3/2013 | Kamata | |

FOREIGN PATENT DOCUMENTS

| | | |
|---|---|---|
| FR | 2911705 A1 | 7/2008 |
| WO | WO 2007/034421 A2 | 3/2007 |

* cited by examiner

RF TRANSMITTER FOR ELECTRICALLY SHORT ANTENNA

This application is a Continuation of co-pending application Ser. No. 13/683,132, filed on Nov. 21, 2012, which claims the benefit under 35 U.S.C. §119(e) of U.S. Provisional Application No. 61/563,618 filed on Nov. 25, 2011 and under 35 U.S.C. §119(a) of patent application Ser. No. 11/190,731.7 filed in Europe on Nov. 25, 2011. The entire content of all of the above applications is hereby incorporated by reference.

TECHNICAL FIELD

The present invention relates to a radio-frequency (RF) transmitter for transmitting electromagnetic signals via an electrically short antenna.

The invention may e.g. be useful in wireless communication involving portable and/or battery-operated apparatuses, such as wireless communication between hearing devices and auxiliary devices. Hearing devices may e.g. be hearing aids for compensating for a hearing-impaired person's loss of hearing capability or listening devices for augmenting a normal-hearing person's hearing capability.

BACKGROUND ART

RF antennas for transmission of electromagnetic signals are preferably designed to have a size of at least one quarter of the wavelength of the transmitted signal, since this generally allows high antenna efficiency, wide bandwidth and substantially real input impedance. However, many apparatuses do not have room for an antenna large enough to satisfy this condition. For an RF signal with a frequency of e.g. 100 MHz, one quarter of the wavelength equals 0.75 m. It is thus common to utilise antennas that are considerably smaller than one quarter of the wavelength. Such antennas are generally referred to as "electrically short" or "electrically small" antennas. Electrically short antennas inherently exhibit low radiation resistance and low efficiency. Their efficiency may be increased by reducing resistive losses in the antenna and the associated circuits, which, however, increases the quality factor (Q) of the antenna so that the bandwidth decreases. At a typical quality factor of 50, the 3-dB bandwidth of the antenna is 2% of the centre frequency.

The co-pending patent application EP 11 184 079.9 and the corresponding provisional patent application U.S. 61/543,821 disclose a transmitter for transmitting an electromagnetic signal via an electrically short antenna. The transmitter comprises a reactive energy storage, which forms a resonance circuit with the antenna. The transmitter further comprises a number of output stages, which provide an electric transmission signal to the resonance circuit. The electric transmission signal is frequency- and/or phase-modulated with an information signal and thus has an instantaneous frequency that varies in dependence on the information signal. In order to allow efficient transmission of electromagnetic signals with a bandwidth exceeding that of the resonance circuit, the transmitter dynamically changes the resonance frequency of the resonance circuit by changing the effective reactance of the energy storage in dependence on the information signal. The electronic switch elements used for changing the effective reactance of the energy storage must be protected against high voltages occurring at the antenna terminals. Therefore, the electronic switch elements are not connected directly to the antenna terminals but instead indirectly via voltage dividers formed by serially connected capacitors. The outputs of the individual output stages are similarly connected to the antenna terminals via capacitors forming impedance transformers yielding higher signal voltages at the antenna terminals than at the outputs of the output stages.

In an embodiment disclosed in the above mentioned co-pending patent applications, the transmitter further comprises a receiver circuit connected to the resonance circuit, which allows the transmitter to function as a half-duplex transceiver. In the receive mode, the transmitter can, however, not take advantage of a dynamic change of the resonance frequency of the resonance circuit, since this would require knowledge of the instantaneous frequency of the received signal before receiving it, and this information is obviously only available after receiving the signal. An alternative method for temporarily increasing the bandwidth of the resonance circuit and thus of the receiver is to temporarily add resistive loads to the antenna terminals, e.g. by means of electronic switch elements. This method is not disclosed in the above mentioned applications, but is generally known in the prior art, e.g. from patent application FR 2 911 805. The same method could also be used for temporarily increasing the bandwidth of the resonance circuit during transmission, e.g. in order to allow transmission of signals with a bandwidth exceeding the bandwidths achievable by the dynamic change of the resonance frequency of the resonance circuit. However, adding resistive loads directly to the antenna terminals by means of switches would subject the switches to possibly large signal voltages occurring across the antenna terminals, which could damage the switches or shorten their life-time.

DISCLOSURE OF INVENTION

It is an object of the present invention to provide an RF transmitter, which allows temporarily altering the bandwidth of the resonance circuit without the above mentioned disadvantages.

Further objects are to provide a portable apparatus and a hearing aid comprising such a transmitter connected to an electrically short antenna.

A further object is to provide a use of such a transmitter for transmission of electromagnetic signals via an electrically short antenna without the above mentioned disadvantages.

These and other objects of the invention are achieved by the invention defined in the independent claims and as explained in the following description. Further objects of the invention are achieved by the embodiments defined in the dependent claims and in the detailed description of the invention.

The invention is based on an RF transmitter with two antenna output terminals for connecting to corresponding antenna terminals of an electrically short antenna for transmission of an electromagnetic signal. The transmitter comprises a capacitive energy storage, an output stage and a switching circuit with an open state and a closed state. The capacitive energy storage is adapted to form with the antenna when connected thereto a resonance circuit with a resonance frequency and a quality factor. The output stage is adapted to provide an electric transmission signal to the resonance circuit. The switching circuit comprises a first transistor for switching between the open state and the closed state and is connected to an antenna output terminal through a capacitance formed by the capacitive energy storage such that the maximum signal voltage occurring across the switching circuit in its open state is lower than the maximum signal voltage occurring across the antenna output terminals. In order to allow temporarily altering the bandwidth of the resonance circuit, the transmitter is adapted to alter the quality factor by changing the series resistance of the switching circuit in its closed state.

The achieved solution enables temporarily altering the quality factor without the above mentioned disadvantages of the prior art. In particular, dedicated loss resistances need not to be added to the transmitter, and switches do not need to be added where they could be subjected to high antenna voltages. The achieved solution enables a very compact transmitter design with relatively high overall power efficiency.

Preferably, the transmitter is further adapted to change the series resistance of the switching circuit in its closed state by controlling a gate voltage applied to the first transistor thereby changing the intrinsic on-resistance of the first transistor. This allows a particularly simple way of controlling the quality factor.

Preferably, the switching circuit further comprises a second transistor arranged in series with the first transistor, and the transmitter is further adapted to change the series resistance of the switching circuit in its closed state by controlling a gate voltage applied to the second transistor.

Preferably, the switching circuit further comprises a resistor connected in parallel with the second transistor. This allows achieving predefined quality factors.

Preferably, the transmitter further is adapted to temporarily alter the resonance frequency by switching between the open and closed states of the switching circuit.

Preferably, the switching circuit is comprised in the output stage.

Preferably, the first transistor is an output transistor of the output stage.

Preferably, the transmitter further comprises a bandwidth controller adapted to control the series resistance of the switching circuit in its closed state.

Preferably, the transmitter further comprises calibration means adapted to calibrate the bandwidth controller.

Preferably, the calibration means are adapted to have the output stage provide an electric transmission signal to the resonance circuit and to determine the quality factor in dependence on the electric transmission signal. This allows a simple and robust way of calibrating the bandwidth controller.

Preferably, the calibration means comprises current measurement means for determining a current through an output transistor of the output stage and is adapted to determine the quality factor in dependence on the determined current. This allows for accurate calibration.

The transmitter may comprise a receiver circuit connected to receive signals from the resonance circuit. This allows the transmitter to operate as a transceiver and further facilitates automatic tuning and calibration of the transmitter.

The transmitter may preferably be incorporated in a portable apparatus, e.g. a hearing device.

The transmitter may be used for transmitting an electromagnetic signal via an electrically short antenna.

In the present context, a "hearing device" refers to a device, such as e.g. a hearing aid or an active ear-protection device, which is adapted to improve or augment the hearing capability of an individual by receiving acoustic signals from the individual's surroundings, modifying the acoustic signals electronically and providing audible signals to at least one of the individual's ears. Such audible signals may e.g. be provided in the form of acoustic signals radiated into the individual's outer ears, acoustic signals transferred as mechanical vibrations to the individual's inner ears through the bone structure of the individual's head and/or electric signals transferred directly or indirectly to the cochlear nerve of the individual. The hearing device may be configured to be worn in any known way, e.g. as a unit arranged behind the ear with a tube leading radiated acoustic signals into the ear canal or with a speaker arranged close to or in the ear canal, as a unit entirely or partly arranged in the pinna and/or in the ear canal, as a unit attached to a fixture implanted into the skull bone, etc. More generally, a hearing device comprises an input transducer for receiving an acoustic signal from an individual's surroundings and providing a corresponding electric input signal, a signal processing circuit for processing the electric input signal and an output transducer for providing an audible signal to the individual in dependence on the processed signal.

A "hearing system" refers to a system comprising one or two hearing devices, and a "binaural hearing system" refers to a system comprising one or two hearing devices and being adapted to provide audible signals to both of the individual's ears. Hearing systems or binaural hearing systems may further comprise "auxiliary devices", which communicate with the hearing devices and affect and/or benefit from the function of the hearing devices. Auxiliary devices may be e.g. remote controls, audio gateway devices, mobile phones, public-address systems, car audio systems or music players. Hearing devices, hearing systems or binaural hearing systems may e.g. be used for compensating for a hearing-impaired person's loss of hearing capability or augmenting a normal-hearing person's hearing capability.

As used herein, the singular forms "a", "an", and "the" are intended to include the plural forms as well (i.e. to have the meaning "at least one"), unless expressly stated otherwise. It will be further understood that the terms "has", "includes", "comprises", "having", "including" and/or "comprising", when used in this specification, specify the presence of stated features, integers, steps, operations, elements and/or components, but do not preclude the presence or addition of one or more other features, integers, steps, operations, elements, components and/or groups thereof. It will be understood that when an element is referred to as being "connected" or "coupled" to another element, it can be directly connected or coupled to the other element, or intervening elements may be present, unless expressly stated otherwise. As used herein, the term "and/or" includes any and all combinations of one or more of the associated listed items. The steps of any method disclosed herein do not have to be performed in the exact order disclosed, unless expressly stated otherwise.

BRIEF DESCRIPTION OF THE DRAWINGS

The invention will be explained in more detail below in connection with preferred embodiments and with reference to the drawings in which.

The figures are schematic and simplified for clarity, and they just show details, which are essential to the understanding of the invention, while other details are left out. Throughout, like reference numerals and/or names are used for identical or corresponding parts.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

MODE(S) FOR CARRYING OUT THE INVENTION

Figure 1:
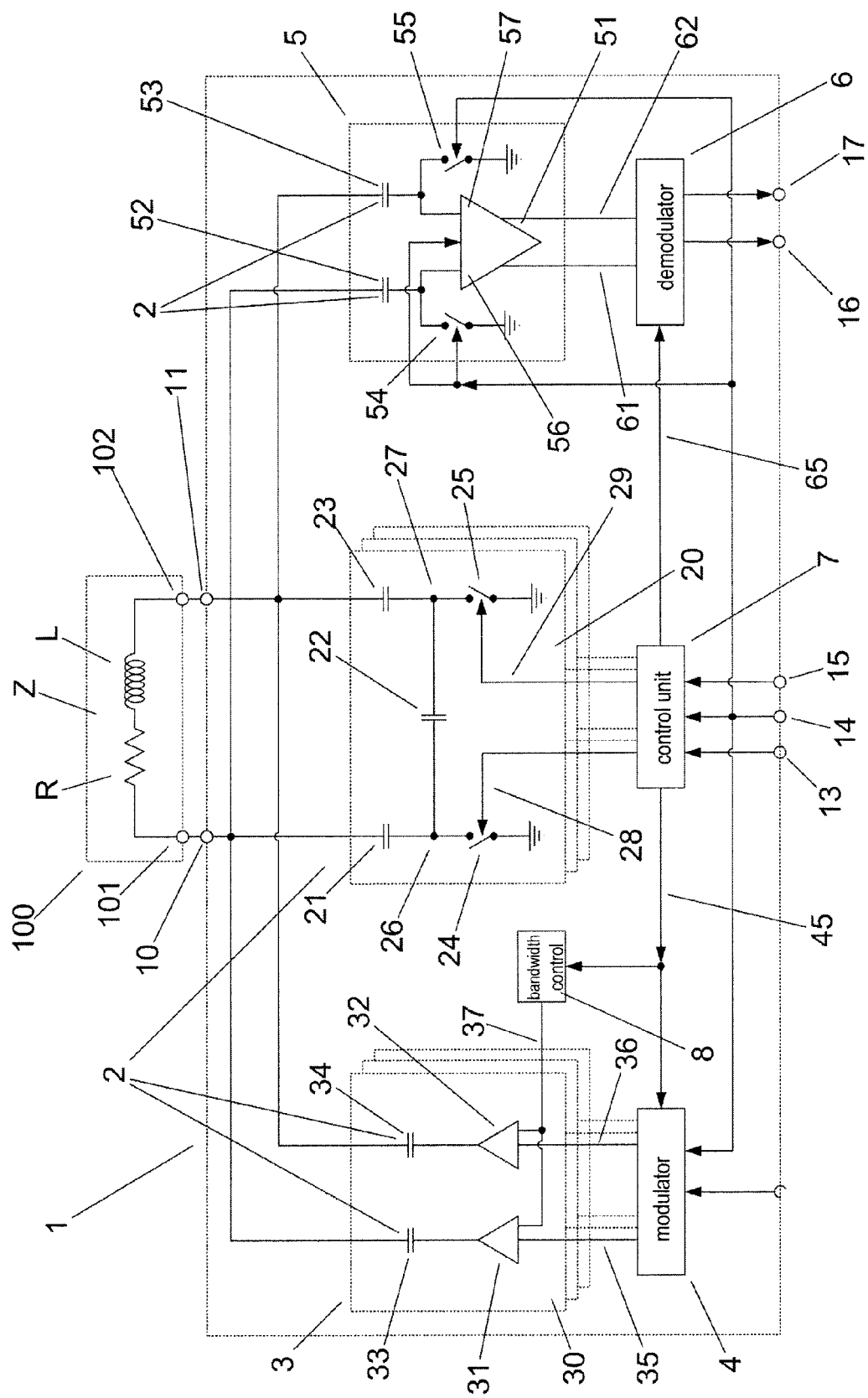
FIG. 1 shows an embodiment of a transmitter according to the invention.

The transmitter 1 shown in FIG. 1 comprises a capacitive energy storage 2, a power amplifier 3, a modulator 4, a receiver circuit 5, a demodulator 6, a control unit 7, a bandwidth controller 8, two antenna output terminals 10, 11 for providing an electric transmission signal, a clock terminal 12 for receiving a clock signal, a data input terminal 13 for receiving an information signal D (see FIG. 6), a mode input terminal 14 for receiving a mode control signal, a tuning input terminal 15 for receiving a tuning control signal, a receive data terminal 16 for providing a receive data signal and a calibration data terminal 17 for providing a calibration data signal.

The energy storage 2 comprises 257 storage circuits 20, one of which is shown in the figure, as well as a number of capacitors 33, 34, 52, 53 that are also comprised in respectively the power amplifier 3 and the receiver circuit 5. Each storage circuit 20 comprises three tuning capacitors 21, 22, 23 and two tuning switches 24, 25. The tuning capacitors 21, 22, 23 are connected in series between the antenna output terminals 10, 11, thereby defining a first and a second node 26, 27 between them. The first tuning switch 24 is connected between the first node 26 and signal ground. The second tuning switch 25 is connected between the second node 27 and signal ground. In each of the tuning switches 24, 25, a control input, which controls opening and closing of the respective tuning switch 24, 25, is connected to receive a respective tuning control signal through a respective tuning control line 28, 29 from the control unit 7. The transmitter 1 has a separate set of tuning control lines 28, 29 for each storage circuit 20.

The power amplifier 3 comprises seven identical dual amplifier circuits 30, one of which is shown in the figure. Each dual amplifier circuit 30 comprises two digital output stages 31, 32 and two output capacitors 33, 34. Each digital output stage 31, 32 has a signal input connected to receive a respective transmit signal from a respective output of the modulator 4 through a respective signal line 35, 36 and a control input connected to receive a common quality factor control signal from the bandwidth controller 8 through a quality factor control line 37. Each digital output stage 31, 32 further has an output connected to provide an amplified output signal corresponding to the transmit signal on its input to a respective one of the antenna output terminals 10, 11 through a respective one of the output capacitors 33, 34. The transmitter 1 has a separate set of signal lines 35, 36 for each dual amplifier circuit 30. The quality factor control line 37 is common for all dual amplifier circuits 30. The output capacitors 33, 34 are also comprised in the capacitive energy storage 2.

The modulator 4 is connected to receive the clock signal from the clock terminal 12, the mode control signal from the mode input terminal 14 and a transmit control signal through a transmit control line 45 from the control unit 7. The modulator 4 is further connected to provide the transmit signals to each of the signal lines 35, 36 for all of the dual amplifier circuits 30.

The receiver circuit 5 comprises a low-noise amplifier 51, two input capacitors 52, 53 and two mode switches 54, 55. Two complementary inputs 56, 57 of the low-noise amplifier 51 are each connected to a respective one of the antenna output terminals 10, 11 through a respective one of the input capacitors 52, 53. The first mode switch 54 is connected between the first input 56 and signal ground, and the second mode switch 55 is connected between the second input 57 and signal ground. In each of the mode switches 54, 55, a control input, which controls opening and closing of the respective mode switch 54, 55, is connected to receive the mode control signal from the mode input terminal 14. Two outputs of the low-noise amplifier 51 are connected to provide a differential receiver output signal to the demodulator 6 through two receiver output lines 61, 62. The low-noise amplifier 51 is further connected to receive the mode control signal from the mode input terminal 14. The input capacitors 52, 53 are also comprised in the capacitive energy storage 2.

The demodulator 6 is connected to receive the differential receiver output signal from the receiver output lines 61, 62 as well as a receive control signal through a receive control line 65 from the control unit 7. The demodulator 6 is further connected to provide the receive data signal to the receive data terminal 16 and the calibration data signal to the calibration data terminal 17.

The control unit 7 is connected to receive the information signal D from the data input terminal 13, the mode control signal from the mode input terminal 14 and the tuning control signal from the tuning input terminal 15. The control unit 7 is further connected to provide individual tuning control outputs to each of the tuning control lines 28, 29 for all of the storage circuits 20, the transmit control signal to the transmit control line 45 and the receive control signal to the receive control line 65.

The bandwidth controller 8 is connected to receive the transmit control signal through the transmit control line 45 from the control unit 7. The bandwidth controller 8 is further connected to provide the quality factor control signal to the quality factor control line 37 to the dual amplifier circuits 30.

A loop antenna 100 external to the transmitter 1 comprises a conductor with one or more windings and two terminals 101, 102, which are each connected to a respective one of the antenna output terminals 10, 11 of the transmitter 1. The antenna 100 forms a complex impedance Z between the antenna output terminals 10, 11, which is modelled by a series connection of an inductor L and a resistor R. The inductance L, i.e. the imaginary part of the impedance Z, is primarily determined by the inductance of the windings of the loop antenna 100, but is also influenced by parasitic capacitances. The resistance R, i.e. the real part of the impedance Z, is primarily determined by the inherent resistance of the conductor and the magnetic induction losses. The resistance R also comprises the radiation resistance of the antenna 100, which, however, is relatively small in an electrically short antenna.

The mode control signal, which must be supplied to the mode input terminal 14 by an external unit, e.g. a signal processor 704 (see FIG. 7), enables one of a transmit mode, in which an electromagnetic signal TX (see FIG. 6) may be transmitted by the transmitter 1, a calibration mode, which allows calibration and tuning of the transmitter 1, and a receive mode, in which an electromagnetic signal may be received by the transmitter 1. Each of the modulator 4, the receiver circuit 5, the demodulator 6 and the control unit 7 receives the mode control signal and reacts to the enabled mode as described in the following.

In the transmit mode and in the calibration mode, the modulator 4 is enabled. Furthermore, the mode switches 54, 55 are closed to connect the inputs 56, 57 of the low-noise amplifier 51 to signal ground, thus protecting them from high voltages provided by the power amplifier 3 to the antenna output terminals 10, 11. The mode switches 54, 55 are implemented as electronic switch elements, e.g. field-effect transistors (FET), which inherently possess a very small, but nevertheless non-zero resistance and/or capacitance in their closed state. Each mode switch 54, 55 thus forms a voltage divider with the respective input capacitor 52, 53, which allows the low-noise amplifier 51 to receive signals from the antenna output terminals 10, 11, however strongly attenuated. In the calibration mode, the low-noise amplifier 51 is enabled to allow amplification of the attenuated signals. The demodulator 6 measures the amplitude and the phase of the amplified signal and provides the measurement results in the calibration data signal. In the transmit mode, the low-noise amplifier 51 is disabled so that its outputs as well as the receive data signal and the calibration data signal from the demodulator 6 are idle.

In the receive mode, the modulator 4 is disabled so that the transmit signals to the power amplifier 3 are idle. The outputs of the digital output stages 31, 32 are thus each tied to a power supply voltage, so that the output capacitors 33, 34 remain connected as substantive loads to the respective antenna output terminal 10, 11. Furthermore, the mode switches 54, 55 are open, so that the low-noise amplifier 51 may receive weak signals from the antenna output terminals 10, 11. The low-noise amplifier 51 amplifies the received signal and provides the amplified signals as a differential receiver output signal to the demodulator 6, which demodulates the differential receiver output signal in accordance with the information received in the receive control signal and provides demodulated data in the receive data signal.

The energy storage 2, which comprises the storage circuits 20 as well as the output capacitors 33, 34 and the input capacitors 52, 53, forms an effective storage capacitance C between the antenna output terminals 10, 11. The effective storage capacitance C further comprises contributions from parasitic capacitances in the transmitter 1, which may be caused by e.g. circuits for protection against electrostatic discharges (ESD). The effective capacitance C depends mainly on the states of the tuning switches 24, 25 in all of the storage circuits 20 and to a lesser degree on the states of the mode switches 54, 55, since the input capacitors 52, 53 are chosen relatively small.

Figure 2:
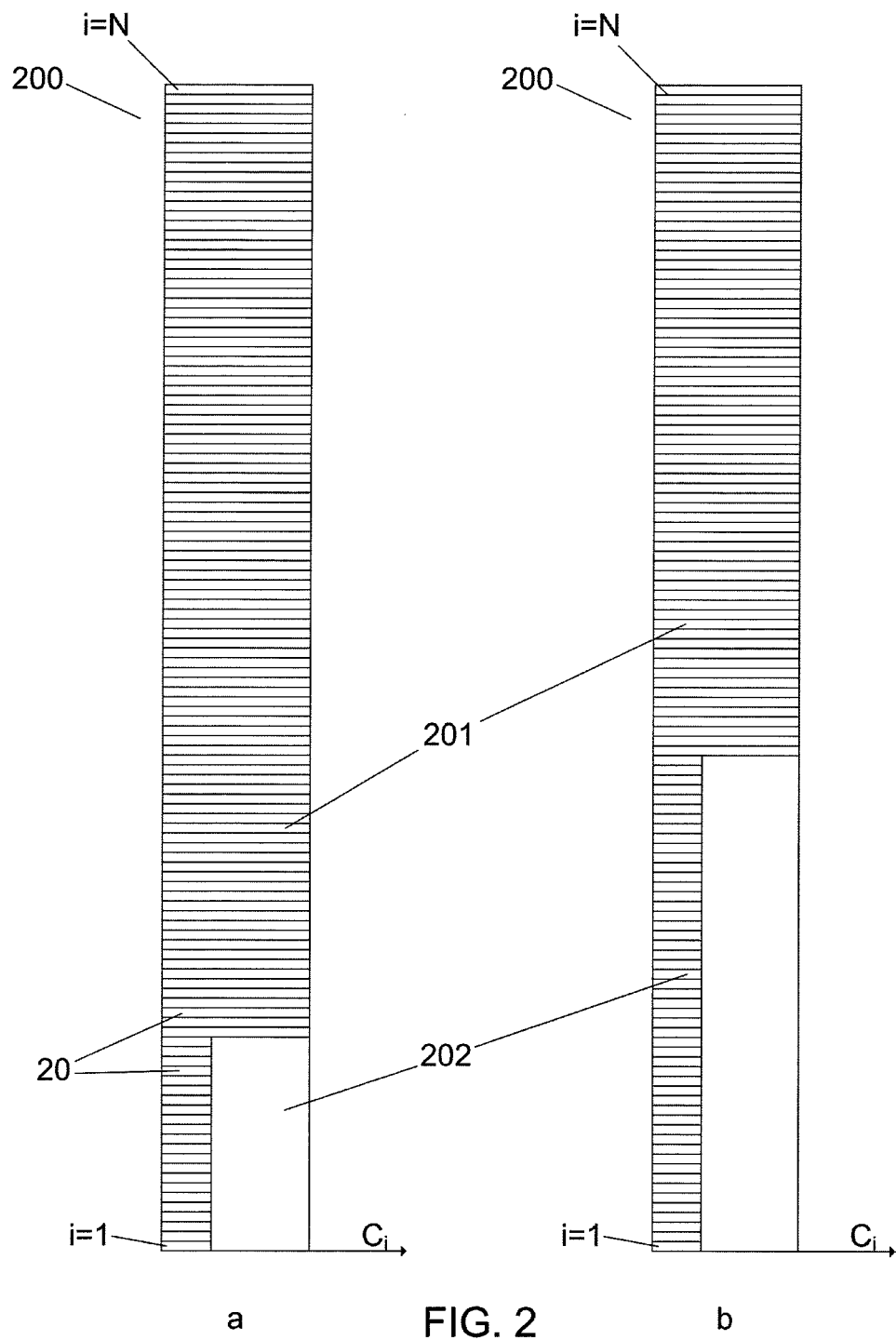
FIG. 2 shows a thermometer-coded array of storage circuits comprised in the transmitter of FIG. 1.

In the capacitive energy storage 2, 255 of the 257 storage circuits 20 are identical and form a linearly-coded—or thermometer-coded—array 200 (see FIG. 2) of storage circuits 20. The function of the thermometer-coded array 200 is illustrated in FIG. 2. The individual storage circuits 20 are numbered from 1 to N. In the shown embodiment, N equals 255. Each storage circuit 20 is illustrated as a rectangle, the width of which is proportional to the effective capacitance $C_i$ of the storage circuit 20, i.e. the contribution of the storage circuit 20 to the effective storage capacitance C. The effective capacitance of the entire thermometer-coded array 200 is thus proportional to the area covered by the rectangles 20. The effective capacitance $C_i$ of each storage circuit 20 may be changed by operating, i.e. opening or closing, one or both of the tuning switches 24, 25 and thus reconfiguring the circuit formed by the tuning capacitors 21, 22, 23. At any time, the thermometer-coded array 200 comprises a (possibly empty) set 201 of storage circuits 20 momentarily having a higher effective capacitance $C_i$ and a (possibly empty) set 202 of storage circuits 20 momentarily having a lower effective capacitance $C_i$.

FIGS. 2a and 2b show the thermometer-coded array 200 in respectively a first and a second state. Since the set 201 of storage circuits 20 having a higher effective capacitance $C_i$ is larger in the first state than in the second state, the effective capacitance of the entire thermometer-coded array 200 is also larger in the first state than in the second state. When changing the effective capacitance of the entire thermometer-coded array 200 from one state (e.g. the first state) to another state (e.g. the second state), the control unit 7 operates the tuning switches 24, 25 such that the effective capacitance $C_i$ of a minimum of storage circuits 20 changes. This may be achieved by only adding storage circuits 20 to the set 201 of storage circuits 20 having a higher effective capacitance $C_i$ when increasing the effective storage capacitance C, and only removing storage circuits 20 from the set 201 of storage circuits 20 having a higher effective capacitance $C_i$ when decreasing the effective storage capacitance C. In other words, when increasing the effective storage capacitance C, none of the storage circuits 20 in the thermometer-coded array 200 are reconfigured to decrease their effective capacitance $C_i$, and vice versa. This allows keeping the electric noise caused by the switching at a minimum, which also allows reducing artifacts in the transmitted electromagnetic signal.

The effective capacitance of the entire thermometer-coded array 200 may be changed with a resolution corresponding to the possible change of the effective capacitance $C_i$ of a single storage circuit 20. An e.g. four times finer resolution across the same range could thus be achieved by using four times the number of storage circuits 20, each with quartered capacitances of the tuning capacitors 21, 22, 23. Instead—in order to save space and power in the transmitter 1, two of the 257 storage circuits 20 are implemented with respectively halved and quartered capacitances of the tuning capacitors 21, 22, 23 compared to the storage circuits 20 in the thermometer-coded array 200. These two storage circuits 20 form a binary-coded array of storage circuits 20, which allows a four times finer resolution at the cost of an only slightly increased switching noise.

Figure 3:
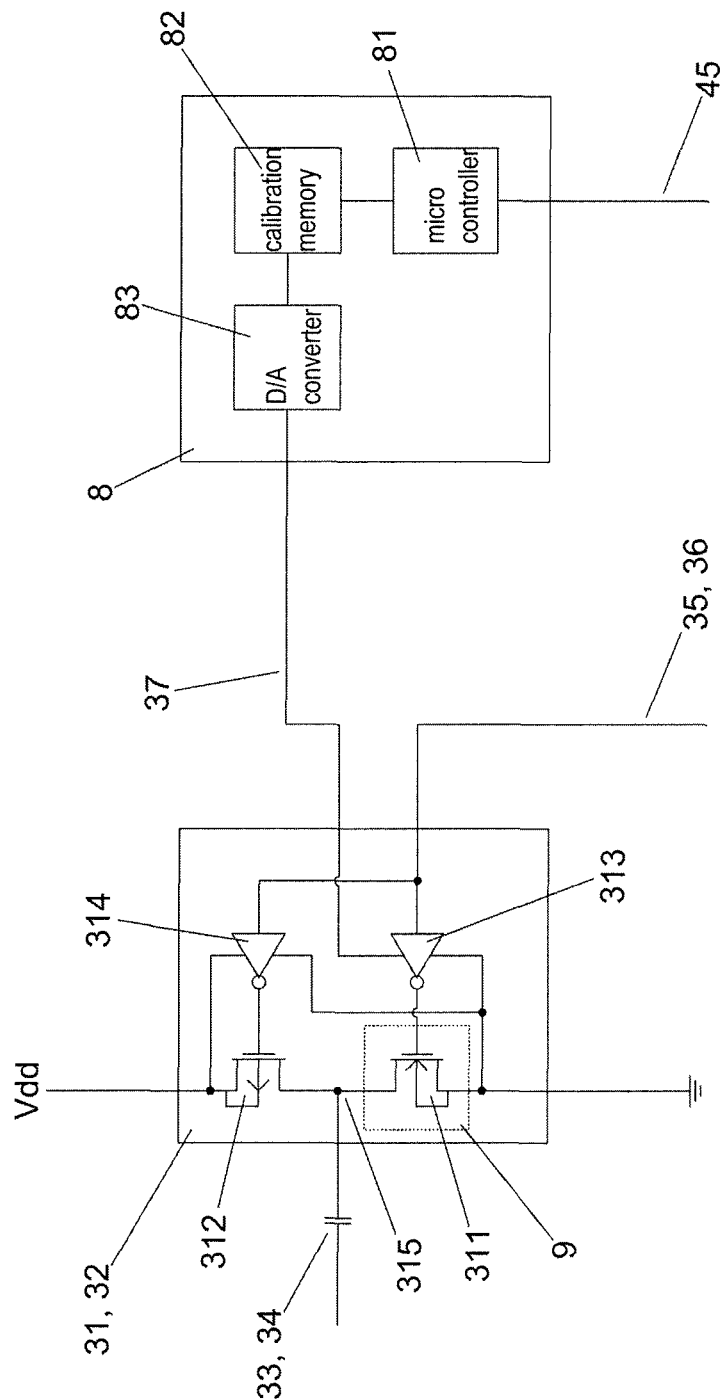
FIG. 3 shows a bandwidth controller and an output stage comprised in the transmitter of FIG. 1.

FIG. 3 shows details of the bandwidth controller 8 and of the digital output stages 31, 32. The output stages 31, 32 are identical and the shown output stage 31, 32 is thus representative of any of these. The output stage 31, 32 comprises an N-channel FET 311, a P-channel FET 312, two inverters 313, 314 and an output terminal 315. The drain terminal of the N-channel FET 311 is connected to the output terminal 315, its source terminal to signal ground and its gate terminal to the output of the first inverter 313. The drain terminal of the P-channel FET 312 is connected to the output terminal 315, its source terminal to a common positive power supply voltage Vdd and its gate terminal to the output of the second inverter 314. The inputs of the first and the second inverters are connected to receive the transmit signal from the modulator 4 through the signal line 35, 36, and their negative power supply terminals are connected to signal ground. The positive power supply terminal of the first inverter 313 is connected to the quality factor control line 37 from the bandwidth controller 8, whereas the positive power supply terminal of the second inverter 314 is connected to the common positive power supply voltage Vdd. The output terminal 315 is connected to one of the antenna terminals 10, 11 through the output capacitor 33, 34. The FETs 311, 312 and the inverters 313, 314 form a digital half-bridge push-pull output stage.

The bandwidth controller 8 comprises a microcontroller 81, a calibration memory 82 and a digital-to-analog converter 83. The microcontroller 81 is connected to receive the transmit control signal from the control unit 7 through the transmit control line 45 and to provide a memory address to the calibration memory 82. The calibration memory 82 is connected to provide a data output to the digital-to-analog converter 83, which is connected to provide the quality factor control signal to the quality factor control line 37.

A high level of the transmit signal on the signal line 35, 36 will cause the inverters 313, 314 to apply low voltages, i.e. voltages slightly above the signal ground potential, to the gate terminals of the FETs 311, 312, which will cause the N-channel FET 311 to have a high drain-source resistance, i.e. to be "off", and the P-channel FET 312 to have a low drain-source resistance, i.e. to be "on", thus providing a high level on the output terminal 315. In the following, the drain-source resistance of an FET, when it is in a state with a low drain-source resistance, is referred to as the intrinsic on-resistance of the FET. The voltage applied to the P-channel FET 312 is low enough to ensure a minimum intrinsic on-resistance in the P-channel FET 312. Conversely, a low level of the transmit signal will cause the inverters 313, 314 to apply high voltages to the gate terminals of the FETs 311, 312, which will cause the N-channel FET 311 to be on and the P-channel FET 312 to be off, thus providing a low level on the output terminal 315. Since the second inverter 314 is supplied with power from the common positive power supply voltage Vdd, the gate voltage applied to the P-channel FET 312 is only slightly below Vdd and thus high enough to ensure that the P-channel FET 312 has a maximum drain-source resistance. The gate voltage applied to the N-channel FET 311 is, however, slightly below the voltage on the quality factor control line 37. Since the intrinsic on-resistance in an FET depends on the gate-source voltage, the intrinsic on-resistance in the N-channel FET 311 may thus be controlled by varying the voltage on the quality factor control line 37.

In operation, the microcontroller 81 decodes the required quality factor indicated in the transmit control signal from the control unit 7 (see further below) and computes a corresponding memory address for the calibration memory 82. The calibration memory 82 outputs the content of the memory cell with the indicated address to the digital-to-analog converter 83, which converts the data into a voltage on the quality factor control line 37 and thus determines the intrinsic on-resistance in the N-channel FET 311. When the level of the transmit signal is low, the intrinsic on-resistance in the N-channel FET 311 thus forms a resistive load to the antenna 100 through the output capacitor 34 and thus affects the quality factor Q and the bandwidth of the resonance circuit 2, 100. The bandwidth controller 8 may thus alter the quality factor Q and the bandwidth of the resonance circuit 2, 100 by varying the voltage on the quality factor control line 37.

In the embodiment shown in FIG. 3, the N-channel FET 311 thus forms a switching circuit 9 with an open state, i.e. when the N-channel FET 311 is off, and a closed state, i.e. when the N-channel FET 311 is on. The series resistance of the switching circuit 9 in its closed state is thus varied by varying the intrinsic on-resistance in the N-channel FET 311.

Figure 4:
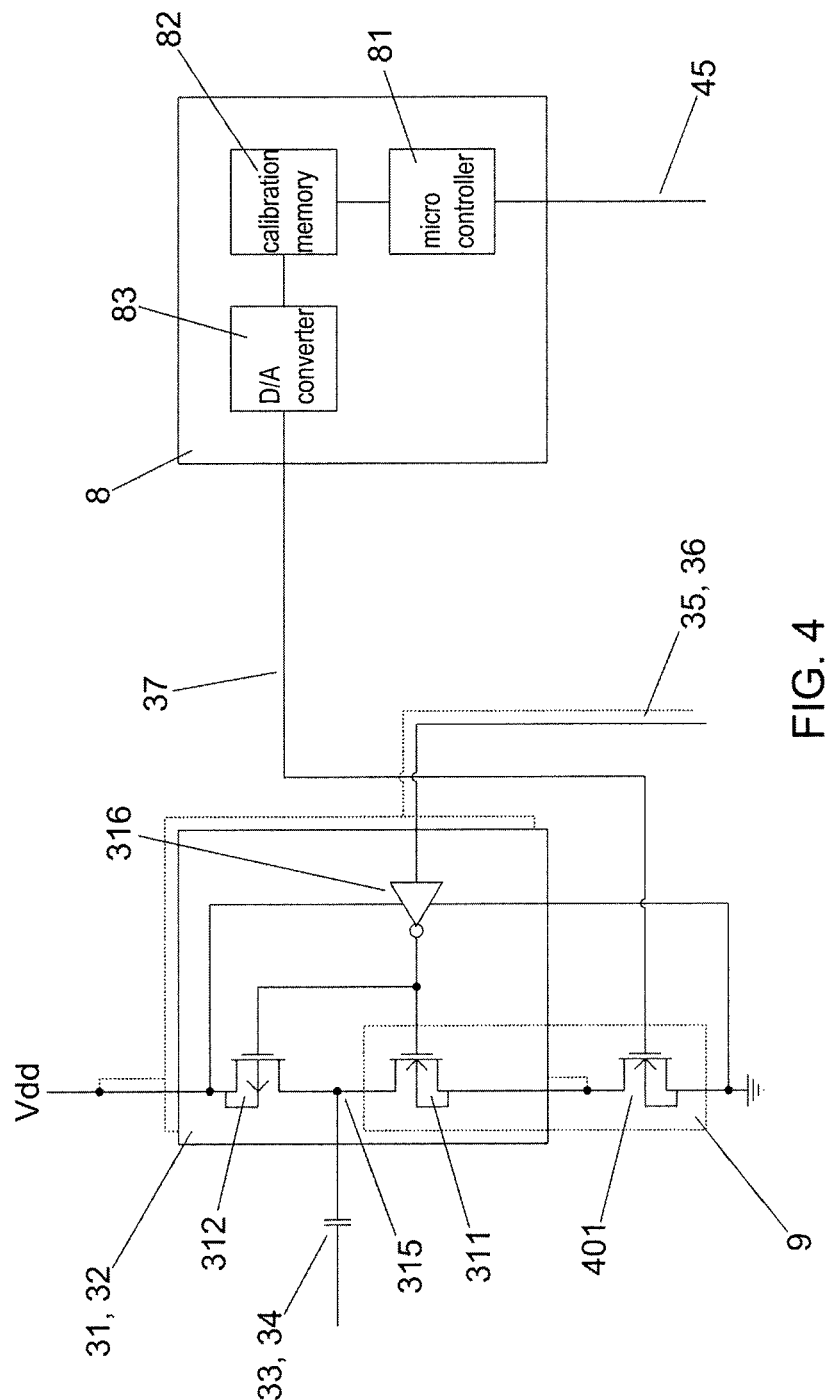
FIG. 4 shows an alternative embodiment of a switching circuit shown in FIG. 3.

In the alternative embodiment shown in FIG. 4, the gate terminals of the FETs 311, 312 are connected to the output of a common inverter 316, which is supplied with power from the common positive power supply voltage Vdd and signal ground. A further N-channel FET 401 is connected in series with the N-channel FET 311 such that it forms a variable resistance between the source terminal of the N-channel FET 311 and signal ground. The gate terminal of the further N-channel FET 401 is connected to the quality factor control line 37 from the bandwidth controller 8. In this embodiment, varying the voltage on the quality factor control line 37 causes the drain-source resistance in the further N-channel FET 401 to vary. Similarly to the embodiment shown in FIG. 3, when the level of the transmit signal is low, the intrinsic on-resistance in the further N-channel FET 401 forms a resistive load to the antenna 100 through the N-channel FET 311 and the output capacitor 34 and thus affects the quality factor Q and the bandwidth of the resonance circuit 2, 100. The bandwidth controller 8 may thus alter the quality factor Q and the bandwidth of the resonance circuit 2, 100 by varying the voltage on the quality factor control line 37.

In the embodiment shown in FIG. 4, the switching circuit 9 comprises both the N-channel FET 311 and the further N-channel FET 401. Again, the open and closed states of the switching circuit 9 correspond respectively to a state in which the N-channel FET 311 is off and a state in which the N-channel FET 311 is on. The series resistance of the switching circuit 9 in its closed state is thus varied by varying the intrinsic on-resistance in the further N-channel FET 401.

The embodiment shown in FIG. 4 has the advantage that the load on the digital-to-analog converter 83 only changes when a change in the quality factor Q is invoked, whereas in the embodiment of FIG. 3, the load on the digital-to-analog converter 83 changes every time the transmit signal changes. This may allow a lower power consumption in the bandwidth controller 8. Furthermore, instead of using a separate further N-channel FET 401 for each output stage 31, 32, several output stages 31, 32 may be connected to a common further N-channel FET 401.

In an alternative embodiment shown in FIG. 5a, the further N-channel FET 401 is replaced by an electronic switch element 501 in parallel with a resistor 502, and a control input of the electronic switch element 501 is connected to allow opening and closing of the electronic switch element 501 by means of the quality factor control signal on the quality factor control line 37. When the electronic switch element 501 is closed, the resistance in series with the N-channel FET 311 is at a minimum. When the electronic switch element 501 is open, the resistance in series with the N-channel FET 311 equals the resistance of the resistor 502. In this embodiment, the switching circuit 9 comprises the N-channel FET 311, the electronic switch element 501 and the resistor 502, and it allows varying the quality factor Q between two predetermined values. The electronic switch element 501 may e.g. be an FET controlled by a gate voltage.

In a further alternative embodiment shown in FIG. 5b, multiple resistors 502 are connected in parallel with the electronic switch element 501, each in series with a further electronic switch element 503 such that the resistance provided in series with the N-channel FET 311 when the electronic switch element 501 is open, may be varied by opening and closing different combinations of the further electronic switch elements 503. The quality factor control signal is preferably implemented as a multi-bit digital signal in order to allow individual control of each of the electronic switch elements 501, 503. In this embodiment, the switching circuit 9 comprises the N-channel FET 311, the electronic switch elements 501, 503 and the resistors 502, and the quality factor Q may be varied between a number of predetermined values depending on the number and individual resistances of the resistors 502. The multiple resistors 502 may be identical or they may have different resistances in order to widen the range of obtainable series resistances. Each of the further electronic switch elements 503 may e.g. be an FET controlled by a gate voltage.

Figure 5:
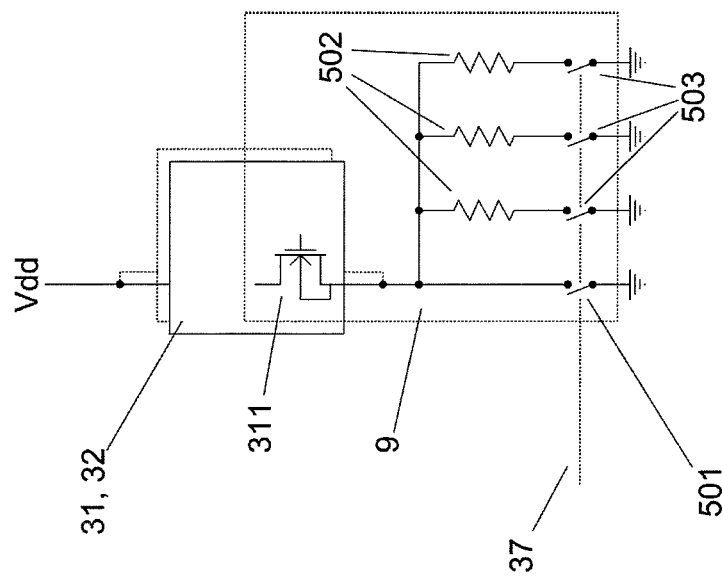
FIG. 5 shows further alternative embodiments of the switching circuit of FIG. 3.
Figure 5:
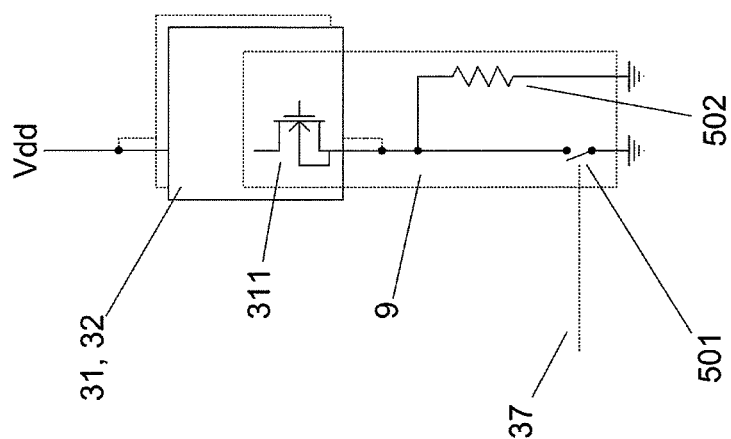

In the embodiments shown in FIGS. 3, 4 and 5, the transmit signal must be set to a low level for the resistive load to affect the quality factor Q. This is obviously achievable in the receive mode, where the output levels of the output stages do not otherwise affect the received signal. In the transmit mode, however, it is generally desirable that the resistive load be maintained consistently and thus for both positive and negative values of the transmit signal. In order to achieve this, switching circuits (not shown) similar to the switching circuits 9 around the N-channel FET may be implemented around the P-channel FET 312. The series resistance of such switching circuits around the P-channel FET 312 may be controlled in manner similar to how the series resistance of the switching circuits 9 around the N-channel FET is controlled. This does, however, require the bandwidth controller 8 to output a further voltage signal for this purpose. As an alternative, two output stages 31, 32 or two groups of output stages 31, 32 may be operated to function as full-bridge push-pull output stages, such that at any time, at least one group has a low-level transmit signal on its input. If identical switching circuits 9 are implemented in the output stages 31, 32 of both groups and all of these are connected to the quality factor control line 37, e.g. as shown in FIG. 3, 4 or 5, then the resistive loads of these groups will alternately control the quality factor Q when the transmit signal alternates between high and low levels. Thus, the quality factor is maintained consistently in both the positive and negative phases of the transmit signal.

The switching circuits 9 of FIG. 3, 4 or 5 may alternatively or additionally be implemented in the variable capacitance portion of the capacitive energy storage 2, e.g. in the storage circuits 20. For this purpose, similar switching circuits 9 may be applied to each or any of the tuning switches 24, 25. The series resistance of these switching circuits 9 may be controlled by the same quality factor control signal or by a further quality factor control signal provided by the bandwidth controller 8. A disadvantage of such a configuration is, however, that at least some of the tuning switches 24, 25 must be closed to allow control of the quality factor Q, which may impose undesired constrains on the range of achievable combinations of resonance frequency $f_0$ and quality factor Q. On the positive side counts that the combined capacitance of the series capacitors 21, 23 in the variable capacitance portion of the capacitive energy storage 2 may be substantially larger than the combined capacitance of the output capacitors 33, 34, e.g. five times or ten times larger, so that altering the series resistance of the switching circuits 9 will have a larger effect when the switching circuits 9 resides in the variable capacitance portion of the capacitive energy storage 2.

In order for the series resistance of a switching circuit 9 to have a substantial effect on the quality factor Q, the switching circuit 9 should preferably be connected to an antenna terminal 10, 11 through a major capacitance, such as one of the tuning capacitors 21, 23 or one of the output capacitors 33, 34. The input capacitors 52, 53 are less suited for this purpose due to their relative small capacitances.

The transmitter 1 is implemented in an integrated circuit (not shown). This not only allows reducing the circuit size and production costs, but also facilitates series production of transmitters 1 with reproducible properties.

Figure 6:
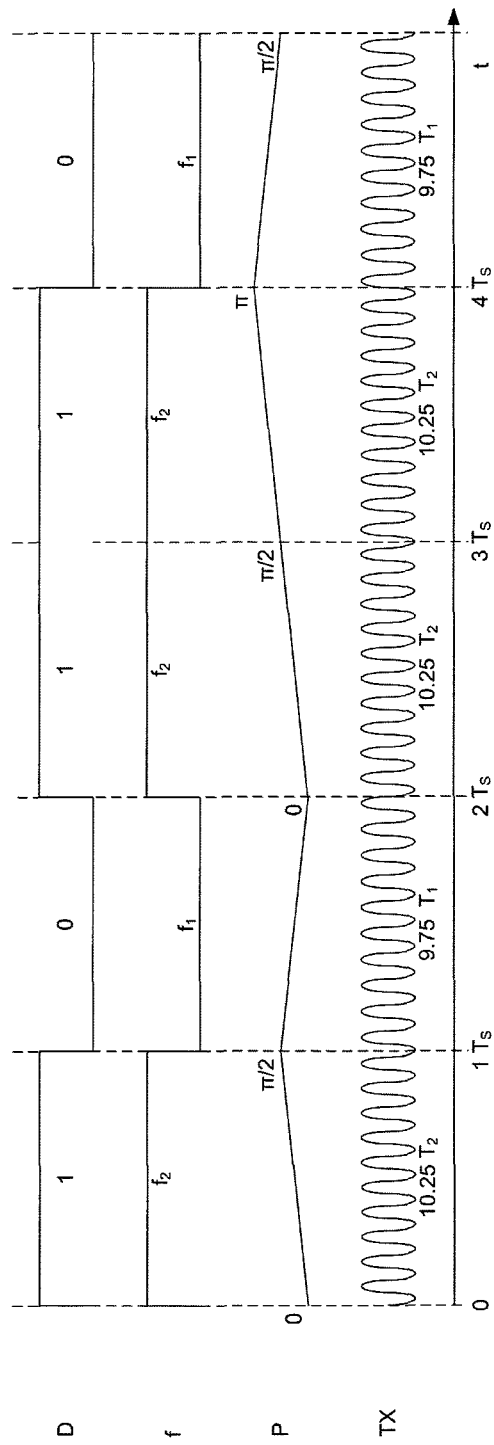
FIG. 6 shows example signals relating to the transmitter in FIG. 1.

FIG. 6 shows example signals for the transmit mode and the calibration mode along a time axis t. An information signal D comprises a stream of binary data or symbols (0/1) with a sample interval $T_s$ of e.g. 5 μs. An electromagnetic signal TX is transmitted at an instantaneous frequency f, which alternates between two transmit frequencies $f_1$, $f_2$ depending on the information signal D being respectively 0 or 1. The carrier frequency $f_c$, which is the mean of the transmit frequencies $f_1$, $f_2$, is 10 times the data rate (200 kHz) of the information signal D, e.g. 2 MHz. The modulation depth is 1/40, so that $f_1$ and $f_2$, respectively, equal 39/40 $f_c$ and 41/40 $f_c$, e.g. 1.95 MHz and 2.05 MHz. Consequently, 9.75 signal periods are transmitted during a 0-sample interval $T_s$ and 10.25 signal periods during a 1-sample interval $T_s$ so that the phase P of the transmitted electromagnetic signal TX shifts by plus or minus π/2 for each sample interval $T_s$. This modulation is commonly known as minimum-shift keying (MSK), which is a type of continuous-phase frequency-shift keying (CP-FSK). The relative 3 dB-bandwidth of the transmitted electromagnetic signal TX is about 1.2 times the relative data rate, i.e. about 1.2×200 kHz/2 MHz=about 12%.

The energy storage 2 and the antenna 100 form a resonance circuit with a resonance frequency $f_0$ given by $$f_0 = 1/(2\pi \cdot \sqrt{L \cdot C}), \quad (1)$$

a quality factor Q given by $$Q = (1/R_T + 1/R) \cdot \sqrt{L/C} \quad (2)$$

and a 3-dB bandwidth BW given by $$BW = f_0/Q \quad (3)$$

wherein L, C and R are defined as described further above, and $R_T$ is a resistance in series with one of the antenna output terminals 10, 11 which models losses in the transmitter 1. The equations are approximations that are valid for higher values of the quality factor Q.

The antenna 100 and the transmitter 1 should be dimensioned such that the range of resonance frequencies $f_0$ obtainable by changing the effective storage capacitance C by means of the tuning switches 24, 25 comprises the entire frequency band of the electromagnetic signal TX to be transmitted by the transmitter 1. In the shown transmitter 1, the range of obtainable resonance frequencies $f_0$ comprises several such frequency bands, which allows tuning of the transmitter 1 to any one of a plurality of frequency channels. Alternatively, the range of obtainable resonance frequencies $f_0$ may be smaller than the range of transmit frequencies $f_1$, $f_2$, provided that the obtainable pass-bands comprise the transmit frequencies $f_1$, $f_2$.

The resonance circuit 2, 100 has a maximum quality factor Q of 50 and thus has a minimum relative 3-dB bandwidth of 2%. If the resonance frequency $f_0$ was kept at a fixed value, at least one of the transmit frequencies $f_1$, $f_2$ would thus be outside the minimum 3-dB pass-band of the resonance circuit 2, 100. To avoid this, the transmitter changes the resonance frequency $f_0$ whenever the information signal D changes. The change is effected such that the instantaneous frequency f remains within the pass-band of the resonance circuit 2, 100. To achieve this, the resonance frequency $f_0$ is shifted in the same direction as the shifts in the instantaneous frequency f. Preferably, the change is effected such that the resonance frequency $f_0$ substantially always equals the instantaneous frequency f during transmission. The change in the resonance frequency $f_0$ is effected by changing the effective storage capacitance C. It should be noted that instead of 3 dB, any other suitable attenuation level in the resonance circuit 2, 100, e.g. 10 dB, could be used as criteria for determining whether the instantaneous frequency f is within the pass-band or not.

The tuning control signal, which must be provided to the tuning input terminal 15 by an external unit, e.g. a signal processor 704, indicates the frequency channel(s) to be used for transmission and reception as well as the modulation depth and the modulation type to be used.

In the receive mode, the control unit 7 computes the receive frequency, the receive bandwidth and the required quality factor from the receive channel indicated in the tuning control signal, indicates the receive frequency, the modulation depth and the modulation type in the receive control signal to the demodulator 6, indicates the required quality factor in the transmit control signal to the bandwidth controller 8 and sets the resonance frequency $f_0$ to equal the receive frequency.

In the transmit mode and the calibration mode, the control unit 7 computes the transmit frequencies $f_1$, $f_2$, the transmit bandwidth and the required quality factor from the transmit channel and the modulation depth indicated in the tuning control signal and indicates the desired transmit frequency $f_1$, $f_2$ and the required quality factor in the transmit control signal to the modulator 4 and the bandwidth controller 8. The desired transmit frequency is either $f_1$ or $f_2$, depending on the state of the information signal D. The control unit 7 further sets the resonance frequency $f_0$ to always correspond with the desired transmit frequency $f_1$, $f_2$. The control unit 7 controls the effective storage capacitance C, and thereby also the resonance frequency $f_0$, through the tuning control signals provided to the tuning control lines 28, 29.

In the shown transmitter 1, the control unit 7 preferably commands the bandwidth controller 8 to switch between a relatively small bandwidth in the transmit mode and a relatively large bandwidth in the receive mode, so that the effective transmit and receive signal bandwidths may be equal. The bandwidth controller 8 may alternatively be used in a transmitter without dynamic control of the resonance frequency, in which case, the bandwidth should be controlled to match the currently desired transmit or receive bandwidth.

Alternatively, the control unit 7 may command the bandwidth controller 8 to temporarily set a lower quality factor Q when switching from transmit mode to receive mode in order to temporarily achieve a stronger attenuation of the electric signal in the resonance circuit 2, 100 and thus a faster decay of the transmitted electromagnetic signal TX after transmission. This allows a faster switch from transmit mode to receive mode in half-duplex operation. A configuration with switching circuits 9 in the variable capacitance portion of the capacitive energy storage 2 may be advantageous for this purpose, since it may allow achieving a lower quality factor Q due to larger series capacitances 21, 23, and since all tuning switches 24, 25 may be closed during the decay of the transmitted electromagnetic signal TX, because in this situation, it is likely not important to maintain a specific resonance frequency $f_0$ of the resonance circuit 2, 100.

In an alternative embodiment (not shown), the demodulator 6 comprises a frequency-determining circuit for determining the instantaneous frequency of the signal received and amplified by the receiver circuit 5, and the control unit 7 sets the effective storage capacitance C in dependence on the determined instantaneous frequency. The instantaneous frequency may alternatively be determined from any other signal provided to or by the power amplifier 3, such as a modulator output or the electric transmission signal. In such alternative embodiments, the modulator 4 may be controlled by, or be part of, an external unit.

When a change of the effective storage capacitance C is required to change the resonance frequency $f_0$, the control unit 7 opens and/or closes the tuning switches 24, 25 in a subset of the storage circuits 20. This causes a reconfiguration of the respective storage circuits 20 so that they alter their effective capacitance C. In order to avoid losing energy in the energy storage 2 and/or producing glitches during switching, the control unit 7 controls the timing of switch closings such that they take place when the respective tuning switch 24, 25 has a minimum voltage across its terminals. In the disclosed embodiment, the power supply voltages are asymmetric with respective to signal ground, e.g. 1.25 V and 0 V respectively, and the tuning switches 24 and 25 of each storage circuit 20 must thus be closed at different points in time to achieve this. In embodiments with symmetric power supply voltages, the control unit 7 may instead close the tuning switches 24 and 25 simultaneously. In the disclosed embodiment, the effective capacitance $C_i$ of each storage circuit 20 increases when the control unit 7 closes the tuning switches 24, 25 and decreases when it opens the tuning switches 24, 25. The intermediate capacitor 22 ensures that the voltage across an open tuning switch 24, 25 does not reach the high levels occurring on the antenna output terminals 10, 11.

In the disclosed embodiment, the effective reactance between the antenna output terminals 10, 11 substantially equals the effective storage capacitance C and is thus substantially capacitive. Also, the individual reactance elements, i.e. the tuning capacitors 21, 22, 23, comprised in the energy storage 2 are substantially capacitive. The energy storage 2 may, however, additionally or alternatively comprise one or more inductive reactance elements, such as inductors.

The modulator 4 uses the clock signal to derive a stable time reference for the transmit signals provided to the digital output stages 31, 32. The transmit signals are provided as square-wave signals. The modulator 4 provides the transmit signals so that the instantaneous fundamental frequency f of the electric transmission signal provided by the power amplifier 3 to the antenna output terminals 10, 11 equals the desired transmit frequency indicated in the transmit control signal. The output of each digital output stage 31, 32 alternates between a power supply voltage and signal ground in dependence on the transmit signal on its input. These square-wave output signals are led to the antenna output terminals 10, 11 through the output capacitors 33, 34, which cooperate with the other capacitances in the transmitter 1 to form impedance transformers. This allows the signal voltage at the antenna output terminal 10, 11 to exceed the signal voltages on the outputs of the output stages 31, 32.

The modulator 4 provides the transmit signals such that within each dual amplifier circuit 30, the digital output stage 31, 32 receive transmit signals that are inverted with respect to each other. Thus, each dual amplifier circuit 30 provides an either positive or negative contribution to the differential voltage across the antenna output terminals 10, 11. The availability of seven identical dual amplifier circuits 30 allows controlling the output of the power amplifier 3 to any one of a number of different levels by controlling the timing of transitions in the transmit signals, or alternatively or additionally idling one or more of the transmit signals. The output of the power amplifier 3 may further be shaped to reduce the amount of radiated harmonics. To achieve this, the modulator 4 may control the transitions in the transmit signals on the individual signal lines 35, 36 such that the electric transmission signal to the antenna 100 is as close to a pure sine wave signal as possible during each sample interval $T_s$. The resonance circuit 2, 100 further functions as a steep band-pass filter, which suppresses a major portion of the harmonics.

The demodulator 6 demodulates the differential receiver output signal according to the receive frequency, the modulation depth and the modulation type indicated in the receive control signal from the control unit 7. Preferably, the received signal is modulated with the same type of modulation as is applied to the transmitted electromagnetic signal TX, and the data rates used for transmission and reception of signals are equal. In this case, the receiver 5 and/or the demodulator 6 may comprise means for improving reception of electromagnetic signals residing outside the 3-dB passband of the resonance circuit 2, 100. Such means may comprise e.g. a filter adapted to at least partly compensate for the amplitude and phase changes caused by the resonance circuit 2, 100. Such means are e.g. described in the co-pending patent application EP 2 367 294. Alternatively, the transmitter 1 may be used for receiving signals with a data rate smaller than the transmitted data rate. In this case, means for improving out-of-band reception may be omitted. Alternatively or additionally, the bandwidth controller 8 may be used to set different bandwidths of the resonance circuit 2, 100 for the transmit and receive modes. The demodulator 6 may derive a time base for demodulation from the received signal or, alternatively, from the clock signal. In the latter case, the clock signal should also be routed from the clock terminal 12 to the demodulator 6.

The receiver circuit 5 allows the transmitter 1 to operate as a half-duplex transceiver by switching between the receive mode and the transmit and/or the calibration mode. In the calibration mode, the receiver circuit 5 further allows an external unit, e.g. a signal processor 704, to monitor the amplitude and/or phase of the electric transmission signal on the antenna output terminals 10, 11 and thus to achieve a calibrated transmitter output as well as to tune the resonance frequency of the resonance circuit 2, 100 by methods already known in the art. It also allows achieving a calibrated quality factor Q in the resonance circuit, e.g. by performing measurements comprising frequency sweeps and/or at discrete frequencies. The transmitter 1 may alternatively comprise own means for monitoring the amplitude and/or phase of the electric transmission signal, such as a circuit in the demodulator 6. The control unit 7 may receive an output of such means and automatically change the effective storage capacitance C to achieve maximum amplitude of the electric transmission signal during transmission. Similarly, the transmitter 1 may comprise own means for monitoring the amplitude and/or phase of the current through the output transistors 311, 312 of the output stages 31, 32 for the purpose of determining the resonance frequency and/or the quality factor Q of the resonance circuit 2, 100. Automatic adjustment or calibration of the resonance circuit 2, 100 and/or the bandwidth controller 8 may take place continuously during transmission, at specific time intervals, e.g. once per minute, hourly, daily or weekly, or at specific events, such as upon start-up of the transmitter 1. Instead of a full-power transmitted signal, transmission of a weaker test signal may be used for calibration. Calibration results for the quality factor Q may be written to the calibration memory 82 of the bandwidth controller 8 in known fashion.

Figure 7:
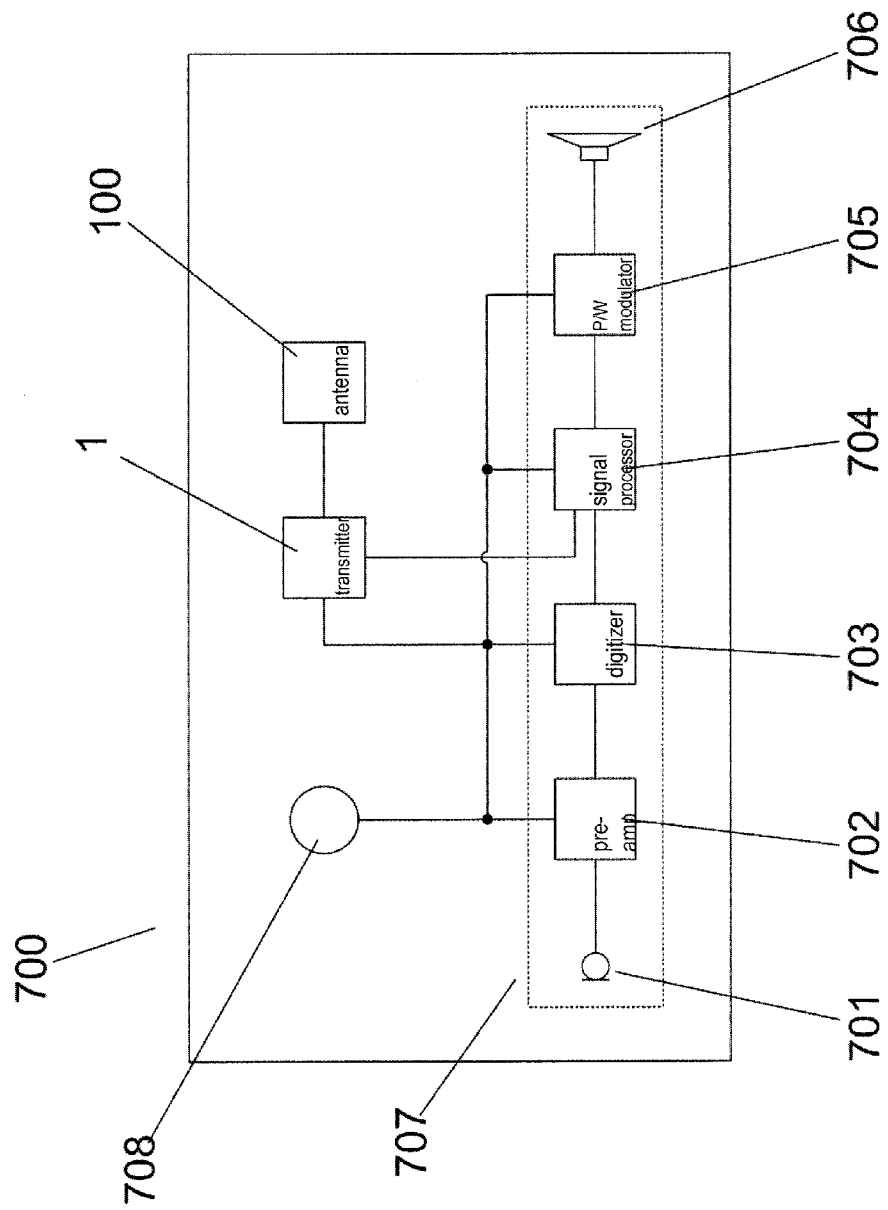
FIG. 7 shows an embodiment of a hearing device comprising the transmitter of FIG. 1.

FIG. 7 shows a hearing device 700, e.g. a hearing aid or an active ear-protection device, comprising a transmitter 1 and a loop antenna 100 configured as described above. The hearing device 700 further comprises a microphone 701, a preamplifier 702, a digitiser 703, a signal processor 704, a pulse-width modulator 705 and a speaker 706 connected to form an audio signal path 707. The hearing device 700 further comprises a battery 708 for powering the transmitter 1 and the devices 702, 703, 704, 705 in the audio signal path 707. The microphone 701 is arranged to receive an acoustic input signal from an individual's surroundings and provide a corresponding microphone signal to the preamplifier 702. The preamplifier 702 is adapted to amplify the microphone signal and provide the amplified microphone signal to the digitiser 703. The digitiser 703 is adapted to digitise the amplified microphone signal and provide a digitised audio signal to the signal processor 704, which is adapted to modify the digitised audio signal in accordance with the purpose of the hearing device 700, i.e. to improve or augment the hearing capability of the individual. The signal processor 704 is adapted to provide the modified audio signal to the pulse-width modulator 705, which is adapted to provide a corresponding pulse-width modulated signal to the speaker 706. The hearing device 700 is adapted to be arranged at or in an ear of the individual, and the speaker 706 is arranged to transmit an acoustic output signal corresponding to the pulse-width modulated signal to the individual.

The signal processor 704 is connected to receive the receive data signal from the receive data terminal 16 of transmitter 1 and the calibration data signal from the calibration data terminal 17 of transmitter 1. The signal processor 704 is adapted to adjust its modification of the digitised audio signal in response to information comprised in the receive data signal and/or to provide the modified audio signal in dependence on an audio signal comprised in the receive data signal. This allows the hearing device 700 to change its audio signal processing in response to e.g. commands, status information and/or audio signals received wirelessly in an electromagnetic signal from a remote device (not shown), and/or to include such audio signals in the acoustic signal transmitted by the speaker 706. The remote device could e.g. be a remote control, a second hearing device located at or in the respective other ear of the individual or an auxiliary device, e.g. a so-called audio gateway device, adapted to transmit an audio signal from an external device, such as e.g. a mobile phone or a TV set, to the hearing device 700.

The signal processor 704 further is connected to the clock terminal 12, the mode input terminal 14 and the tuning input terminal 15 of the transmitter 1 and further is adapted to provide the corresponding signals for controlling the transmitter 1 as described further above. The signal processor 704 further is connected to the data input terminal 13 of the transmitter 1 and further is adapted to provide the information signal D comprising information such as commands, status information, control signals and/or audio signals to the transmitter 1 for transmission to a remote device, which could e.g. be another hearing device for the opposite ear or an auxiliary device.

The signal processor 704 further is adapted to calibrate the bandwidth controller 8. It initially provides appropriate signals to the transmitter 1 in order to set a desired channel frequency and bandwidth as well as to invoke the calibration mode. It then has the transmitter 1 perform a frequency sweep of the transmitted electromagnetic signal TX, simultaneously reads the signal amplitude and phase returned in the calibration data from the demodulator 6 and computes the achieved quality factor Q from the read signal amplitudes and phases. If the computed quality factor Q does not correspond with the desired channel frequency and bandwidth, it commands the bandwidth controller to change the content of the calibration memory 82 in order to improve the correspondence. The tuning control signal and the transmit control signal may comprise dedicated calibration commands for this purpose. Instead of a frequency sweep, measurements at discrete frequencies may be made. Furthermore, instead of reading calibration data from the demodulator 6, currents through one or more of the output transistors 311, 312 may be measured by appropriate means (not shown) and used for computing the actual quality factor Q. The calibration function may alternatively be implemented in the control unit 7 and/or in the bandwidth controller 8.

The audio signal path 707 is preferably implemented mainly as digital circuits operating in the discrete time domain, but any or all parts hereof may alternatively be implemented as analog circuits operating in the continuous time domain. Digital functional blocks of the audio signal path 707 and/or of the transmitter 1 may be implemented in any suitable combination of hardware, firmware and software and/or in any suitable combination of hardware units. Furthermore, any single hardware unit may execute the operations of several functional blocks in parallel or in interleaved sequence and/or in any suitable combination thereof.

The hearing device 700 may be part of a binaural hearing system.

The transmitter 1 may be used in any type of device, most advantageously in battery-driven and/or portable devices.

Further modifications obvious to the skilled person may be made to the disclosed method, system and/or device without deviating from the spirit and scope of the invention. Within this description, any such modifications are mentioned in a non-limiting way. The possible modifications below are mentioned as examples hereof.

The energy storage 2 and/or the storage circuits 20 may configured in many alternative ways, while still allowing dynamic change of the effective storage capacitance C. More specifically, the number of storage circuits 20 may vary; this applies to the total number of storage circuits 20, the number of storage circuits 20 in the thermometer-coded array 200 as well as the number of storage circuits 20 in the binary-coded array.

The power amplifier 3 may alternatively comprise analog output stages. The amplifier circuits 30 may comprise only a single-output output stage. The number of amplifier circuits 30 may vary, and the individual amplifier circuits 30 may differ from each other, e.g. in maximum power.

The control unit 7, the bandwidth controller 8 as well as the content and routing of control signals associated herewith may be implemented in many alternative ways. For instance, the transmit control signal and the receive control signal may be provided by external units.

Alternatively to MSK, any form of frequency or phase modulation may be used for modulating the information signal onto the carrier signal. Such modulation forms include e.g. analog frequency modulation, analog phase modulation, phase-shift keying, frequency-shift keying and combinations hereof. These modulation forms allow both analog and digital information signals to be modulated onto the carrier signal. Especially preferred modulation techniques comprise minimum shift keying and other of the various known modulation techniques that reduce the bandwidth of the transmitted electromagnetic signal TX and thus allow the modulated signal to pass the resonance circuit 2, 100 with minimum attenuation and/or require less dynamic change of the a resonance frequency $f_0$. The power amplifier 3, the modulator 4, the receiver circuit 5, the demodulator 6 and the control unit 7 may obviously need to be adapted to such altered modulation forms.

Furthermore, the sample interval $T_s$, the carrier frequency $f_c$, the relative data rate and the modulation depth may be chosen quite freely. For instance, the carrier frequency $f_c$ may be below 100 MHz, below 30 MHz or below 10 MHz.

The transmitter 1 may be implemented such that it allows the resonance circuit 2, 100 to have a relative 3 dB-bandwidth less than 10% (Q>10), less than 5% (Q>20), less than 3% (Q>~33) or less than 2% (Q>50), depending on e.g. the carrier frequency $f_c$, the bandwidth of the information signal D, the desired communication range, the acceptable bit error rate as well as other requirements for the communication link in which the transmitter 1 is to be used.

The transmitter 1 may be implemented such that it allows the resonance circuit 2, 100 to be tuned to a resonance frequency $f_0$ below 100 MHz, below 30 MHz or below 10 MHz, depending primarily on the desired range of carrier frequencies $f_c$. A lowering of the frequency generally causes lower power consumption. The resonance circuit 2, 100 should, however, preferably be tuned to form a narrow band-pass filter with a resonance frequency $f_0$ above 300 kHz, above 1 MHz or above 3 MHz in order to allow a high data rate (bits per second) in the communication link. Preferred data rates are above 40 kb/s, above 80 kb/s or above 160 kb/s in order to allow transmission and reception of real-time audio signals through the transmitter 1.

The antenna 100 and/or the transmitter 1 may be dimensioned to have a largest physical extension of less than 5 cm, less than 2 cm or less than 1 cm. Small dimensions allow implementation in small devices. The transmitter 1 may further be dimensioned to having a power consumption less than 10 mW, less than 3 mW or less than 1 mW. This allows use of the transmitter 1 in battery-powered devices, such as body-worn hearing devices 700.

Stable transmit frequencies $f_1$, $f_2$ may be derived from e.g. a system clock signal within the device 700 in which the transmitter 1 is comprised. Alternatively, the transmit frequencies $f_1$, $f_2$ may be derived from a dedicated oscillator, e.g. a crystal oscillator or any other oscillator.

Some preferred embodiments have been described in the foregoing, but it should be stressed that the invention is not limited to these, but may be embodied in other ways within the subject-matter defined in the following claims. For example, the features of the described embodiments may be combined arbitrarily, e.g. in order to adapt the system, the devices and/or the method according to the invention to specific requirements.

It is further intended that the structural features of the system and/or devices described above, in the detailed description of 'mode(s) for carrying out the invention' and in the claims can be combined with the methods, when appropriately substituted by a corresponding process. Embodiments of the methods have the same advantages as the corresponding systems and/or devices.

Any reference numerals and names in the claims are intended to be non-limiting for their scope.

The invention claimed is:

1. A transmitter, comprising:
   an antenna output terminal for connecting to a corresponding antenna terminal of an electrically short antenna for transmission of an electromagnetic signal;
   a capacitive energy storage having a total effective capacitance and configured to form with the electrically short antenna when connected to said electrically short antenna a resonance circuit with a resonance frequency and a quality factor;
   an output stage configured to provide an electric transmission signal to the resonance circuit;
   a switching circuit having an open state and a closed state, the switching circuit switching between the open state and the closed state and being connected to the antenna output terminal through a capacitance formed by the capacitive energy storage such that a maximum signal voltage occurring across the switching circuit in its open state is lower than a maximum signal voltage occurring at the antenna output terminal; and
   a battery supplying power to the transmitter via a wired connection, wherein
   the transmitter is adapted to alter the quality factor by changing a series resistance of the switching circuit by changing the switching circuit to its alternate state,
   the capacitive energy storage includes a plurality of capacitive energy storage circuits,
   each of the capacitive energy storage circuits includes at least two tuning switches controlled by a controller and has an effective capacitance $C_i$ based on an open/close state of its tuning switches
   the total effective capacitance of the capacitive energy storage is a sum of the effective capacitances $C_i$ of the capacitive energy storage circuits, and
   the controller is configured to change the effective capacitance $C_i$ of a minimum number of capacitive energy storage circuits to achieve a target total effective capacitance of the capacitive energy storage.

2. The transmitter according to claim 1, wherein
   said plurality of capacitive energy storage circuits includes a first set of capacitive energy storage circuits and a second set of capacitive energy storage circuits,
   each capacitive energy storage circuit of the first set includes a capacitor with capacitance C, and
   each capacitive energy storage circuit of the second set includes a capacitor with capacitance ½C.

3. The transmitter according to claim 2, wherein
   said plurality of capacitive energy storage circuits further includes a third set of capacitive energy storage circuits, and
   each capacitive energy storage circuit of the third set includes a capacitor with capacitance ¼C.

4. The transmitter according to claim 1, wherein the switching circuit includes a first transistor for switching between the open state and the closed state.

5. The transmitter according to claim 4 and further adapted to change the series resistance of the switching circuit in its closed state by controlling a gate voltage applied to the first transistor thereby changing the intrinsic on-resistance of the first transistor.

6. The transmitter according to claim 5 wherein the switching circuit further comprises a second transistor arranged in series with the first transistor and wherein the transmitter is further adapted to change the series resistance of the switching circuit in its closed state by controlling a gate voltage applied to the second transistor.

7. The transmitter according to claim 4 wherein the switching circuit further comprises a second transistor arranged in series with the first transistor and wherein the transmitter is further adapted to change the series resistance of the switching circuit in its closed state by controlling a gate voltage applied to the second transistor.

8. The transmitter according to claim 7, wherein
   the switching circuit further comprises a resistor connected in parallel with the second transistor.

9. The transmitter according to claim 4, wherein
   the first transistor is an output transistor of the output stage.

10. The transmitter according to claim 1, further comprising:
    a bandwidth controller adapted to control the series resistance of the switching circuit in its closed state.

11. The transmitter according to claim 10, further comprising:
    a calibration unit adapted to calibrate the bandwidth controller.

12. The transmitter according to claim 11, wherein
    the calibration unit is configured to have the output stage provide an electric transmission signal to the resonance circuit and to determine the quality factor in dependence on the electric transmission signal.

13. The transmitter according to claim 12, wherein
    the calibration unit comprises a current measurement device for determining a current through an output transistor of the output stage and is adapted to determine the quality factor in dependence on the determined current.

14. The transmitter according to claim 1, further comprising:
    a receiver circuit connected to receive signals from the resonance circuit.

15. The transmitter according to claim 1, wherein
    the transmitter further is adapted to alter the resonance frequency by switching between the open and closed states of the switching circuit.

16. The transmitter according to claim 1, wherein the switching circuit includes an electronic switch for switching between the open state and the closed state.

17. The transmitter according to claim 1, wherein
    the switching circuit is comprised in the output stage.

18. A portable apparatus, comprising:
    an electrically short antenna; and
    a transmitter connected to the electrically short antenna, the transmitter including
      an antenna output terminal for connecting to a corresponding antenna terminal of the electrically short antenna for transmission of an electromagnetic signal;
      a capacitive energy storage having a total effective capacitance and configured to form with the electrically short antenna when connected to said electrically short antenna a resonance circuit with a resonance frequency and a quality factor;
      an output stage configured to provide an electric transmission signal to the resonance circuit; and
      a switching circuit having an open state and a closed state, the switching circuit switching between the open state and the closed state and being connected to the antenna output terminal through a capacitance formed by the capacitive energy storage such that a maximum signal voltage occurring across the switching circuit in its open state is lower than a maximum signal voltage occurring at the antenna output terminal; and a battery within the portable apparatus supplying power to the transmitter, wherein the transmitter is adapted to alter the quality factor by changing a series resistance of the switching circuit by changing the switching circuit to its alternate state, wherein the capacitive energy storage includes a plurality of capacitive energy storage circuits, each of the capacitive energy storage circuits includes at least two tuning switches controlled by a controller and has an effective capacitance $C_i$ based on an open/close state of its tuning switches, the total effective capacitance of the capacitive energy storage is a sum of the effective capacitances $C_i$ of the capacitive energy storage circuits, and the controller is configured to change the effective capacitance $C_i$ of a minimum number of capacitive energy storage circuits to achieve a target total effective capacitance of the capacitive energy storage.

19. A hearing device, comprising:

an electrically short antenna; and a transmitter connected to the electrically short antenna, the transmitter including an antenna output terminal for connecting to a corresponding antenna terminal of the electrically short antenna for transmission of an electromagnetic signal;

a capacitive energy storage having a total effective capacitance configured to form with the electrically short antenna when connected to said electrically short antenna a resonance circuit with a resonance frequency and a quality factor;

an output stage configured to provide an electric transmission signal to the resonance circuit; and a switching circuit having an open state and a closed state, the switching circuit switching between the open state and the closed state and being connected to the antenna output terminal through a capacitance formed by the capacitive energy storage such that a maximum signal voltage occurring across the switching circuit in its open state is lower than a maximum signal voltage occurring at the antenna output terminal; and a battery within the hearing device supplying power to the transmitter, wherein the transmitter is adapted to alter the quality factor by changing a series resistance of the switching circuit by changing the switching circuit to its alternate state, wherein the capacitive energy storage includes a plurality of capacitive energy storage circuits, each of the capacitive energy storage circuits includes at least two tuning switches controlled by a controller and has an effective capacitance $C_i$ based on an open/close state of its tuning switches, the total effective capacitance of the capacitive energy storage is a sum of the effective capacitances $C_i$ of the capacitive energy storage circuits, and the controller is configured to change the effective capacitance $C_i$ of a minimum number of capacitive energy storage circuits to achieve a target total effective capacitance of the capacitive energy storage.

* * * * *